United States Patent
Jin

(10) Patent No.: US 9,368,165 B2
(45) Date of Patent: Jun. 14, 2016

(54) CURRENT GENERATION CIRCUIT AND SEMICONDUCTOR DEVICE HAVING THE SAME

(71) Applicant: SK hynix Inc., Gyeonggi-do (KR)

(72) Inventor: Hyun Jong Jin, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 25 days.

(21) Appl. No.: 14/161,263

(22) Filed: Jan. 22, 2014

(65) Prior Publication Data

US 2015/0036441 A1 Feb. 5, 2015

(30) Foreign Application Priority Data

Jul. 30, 2013 (KR) .................. 10-2013-0090201

(51) Int. Cl.
*G11C 5/14* (2006.01)
*H03K 17/06* (2006.01)

(52) U.S. Cl.
CPC .............. *G11C 5/147* (2013.01); *H03K 17/063* (2013.01)

(58) Field of Classification Search
CPC .............................. G11C 5/147; H03K 17/063
USPC ............. 365/189.07; 327/103, 594, 530, 536, 327/539
See application file for complete search history.

(56) References Cited

U.S. PATENT DOCUMENTS

| | | | | | |
|---|---|---|---|---|---|
| 4,539,491 | A | * | 9/1985 | Nishioka | H03F 3/347 327/103 |
| 5,099,139 | A | * | 3/1992 | Nishimura | H03K 17/6292 327/103 |
| 5,481,212 | A | * | 1/1996 | Shima | G11C 27/026 327/91 |
| 5,584,044 | A | * | 12/1996 | Gouhara | G06F 12/0623 710/26 |
| 5,640,118 | A | * | 6/1997 | Drouot | G05F 3/24 327/205 |
| 5,736,879 | A | * | 4/1998 | Pham | H03K 9/06 327/102 |
| 6,560,133 | B2 | * | 5/2003 | Yanagawa | G11C 15/04 365/189.07 |
| 7,279,941 | B2 | * | 10/2007 | Yonezawa | H03K 3/0231 327/100 |
| 7,479,915 | B1 | * | 1/2009 | Singh | H03K 5/2481 318/729 |
| 7,746,120 | B2 | * | 6/2010 | Umeda | H03F 3/082 327/103 |
| 7,898,268 | B2 | * | 3/2011 | Bernardon | G01R 27/14 324/548 |
| 8,253,452 | B2 | * | 8/2012 | Kushnarenko | G05F 3/30 327/143 |
| 8,373,450 | B2 | * | 2/2013 | Ballenegger | H03F 3/005 327/103 |
| 8,482,342 | B2 | * | 7/2013 | Conte | G05F 3/30 323/313 |
| 2007/0145922 | A1 | * | 6/2007 | Ito | H03K 17/163 318/300 |
| 2008/0042944 | A1 | * | 2/2008 | Kawasaki | G09G 3/3283 345/77 |
| 2008/0313510 | A1 | * | 12/2008 | Baker | 714/718 |
| 2009/0079603 | A1 | * | 3/2009 | Maruyama | H03K 4/502 341/122 |
| 2012/0217951 | A1 | * | 8/2012 | Fonderie | G05F 3/262 323/316 |
| 2012/0326734 | A1 | * | 12/2012 | Cho | G06F 3/0416 324/684 |
| 2013/0293289 | A1 | * | 11/2013 | Ivanov | G05F 3/20 327/539 |

FOREIGN PATENT DOCUMENTS

KR 100185406 4/1999
KR 100335978 6/2002

* cited by examiner

Primary Examiner — Vu Le
Assistant Examiner — Sung Cho
(74) Attorney, Agent, or Firm — IP & T Group LLP

(57) ABSTRACT

A current generation circuit includes a mirroring circuit suitable for being charged by using a bias voltage, wherein a voltage level of the charged voltage varies corresponding to changes in a voltage level of a power voltage, a comparison circuit suitable for comparing the charged voltage with a feedback voltage, and a current driving circuit suitable for generating a current based on a voltage output from the comparison circuit.

13 Claims, 3 Drawing Sheets

CURRENT GENERATION CIRCUIT AND SEMICONDUCTOR DEVICE HAVING THE SAME

CROSS-REFERENCE TO RELATED APPLICATION

The present application claims priority to Korean patent application number 10-2013-0090201, filed on Jul. 30, 2013, the entire disclosure of which is incorporated herein by reference in its entirety.

BACKGROUND

1. Field of Invention

Various embodiments of the present invention relate to an integrated circuit design technology, and more particularly, to a current generation circuit and a semiconductor device having the same.

2. Description of Related Art

A semiconductor device may include a memory cell array and a plurality of circuits. The memory cell array may store data. The circuits may program the memory cell array with data, or read or erase the stored data. In addition, the circuits may include a page buffer unit, a voltage generation circuit, a row decoder, a page buffer unit, a column decoder and an input/output circuit. Among them, the page buffer unit may include a plurality of page buffers. These page buffers may exchange data through bit lines coupled to the memory cell array; sense data transferred through the bit lines, during read and verification operations; and output a sensing result. For example, the page buffers may compare a current of the data transferred through the bit lines with a reference current, and output data based on a comparison result.

However, since the page buffers operate simultaneously during the read and verification operations, a voltage (e.g., power voltage) being applied to the circuits may be temporarily reduced. The temporary reduction in the voltage may cause the reference current to be temporarily changed, and the reliability of a sensing operation of the page buffers may be reduced due to the temporary change in the reference current.

BRIEF SUMMARY

Exemplary embodiments of the present invention are directed to a current generation circuit that may generate a current having a constant level despite presence of variations in a power voltage and a semiconductor device having the same.

A current generation circuit according to an exemplary embodiment of the present invention may include a mirroring circuit suitable for being charged by using a bias voltage, wherein a voltage level of the charged voltage varies corresponding to changes in a voltage level of a power voltage, a comparison circuit suitable for comparing the charged voltage with a feedback voltage, and a current driving circuit suitable for generating a current based on a voltage output from the comparison circuit.

A semiconductor device according to an exemplary embodiment of the present invention may include a memory cell array including a plurality of memory blocks storing data, a page buffer unit suitable for exchanging data with the memory cell array through bit lines and performing a sensing operation using a reference current, and a current generation circuit suitable for generating the reference current, which is constant regardless of variations in a voltage level of a power voltage, and supplying the reference current to the page buffer unit.

A memory system according to an exemplary embodiment of the present invention may include a memory control unit suitable for outputting control signals through plurality of pins in response to an external command input through a system bus, a memory interface unit suitable for outputting interface signals including a command signal and an address in response to the control signals, and a memory storage unit including a semiconductor device storing data, wherein the semiconductor device includes a current generation circuit suitable for generating a reference current, which is constant regardless of variations in a voltage level of a power voltage.

DESCRIPTION OF EMBODIMENTS

Figure 1:
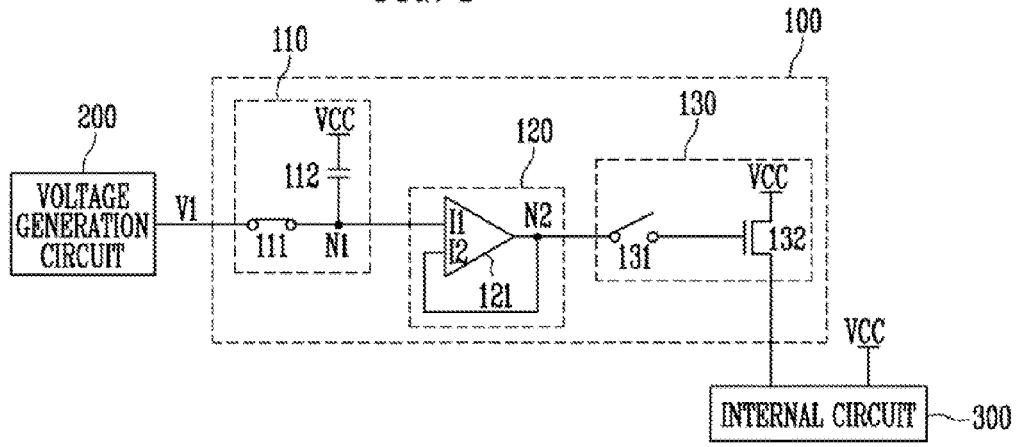
FIG. 1 is a circuit diagram illustrating a current generation circuit according to an embodiment of the present invention.

Hereinafter various embodiments of the present invention will be described in detail with reference to the accompanying drawings. The figures are provided to enable those of ordinary skill in the art to make and use the present invention according to the exemplary embodiments of the present invention. Throughout the disclosure, reference numerals correspond directly to the like numbered parts in the various figures and embodiments of the present invention.

Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

FIG. 1 is a circuit diagram illustrating a current generation circuit according to an embodiment of the present invention.

Referring to FIG. 1, the current generation circuit 100 may receive a first voltage V1, which is generated by a voltage generation circuit 200, and generate a predetermined current (e.g., a reference current) and transfer the constant current to the internal circuit 300.

The current generation circuit 100 may include a mirroring circuit 110, a comparison circuit 120 and a current driving circuit 130.

The mirroring circuit 110 may be charged by using the first voltage V1, which is generated from the voltage generation circuit 200, and a power voltage VCC when the current generation circuit 100 operates in a sample mode. For example, the voltage generation circuit 200 may generate the first voltage V1 having a higher voltage level than that of the power voltage VCC. The mirroring circuit 110 may include a first switch 111 and a capacitor 112. The first switch 111 may transfer the first voltage V1 to the first node N1 or block the first voltage V1. The capacitor 112 may be coupled between the first node N1 and a power voltage VCC terminal and be charged by using the first voltage V1. The first switch 111 may be turned on when the current generation circuit 100 operates in the sample mode and turned off when the current generation circuit 100 operates in a hold mode. The first switch 111 may be controlled by a control circuit (denoted by 1200 of FIG. 4).

The comparison circuit 120 may include an operational amplifier 121. The operational amplifier 121 may compare voltages applied to a first input terminal and a second input terminal I2, and output a result of comparison to a second node N2. For example, the voltage charged in the capacitor 112 may be applied to the first input terminal I1 of the comparison circuit 120, and a feedback voltage may be applied to the second input terminal I2. The feedback voltage may be substantially the same as a voltage output from the comparison circuit 120. In this case, the operational amplifier 121 operates as a unity gain buffer, which generates an output voltage following an input voltage.

The current driving circuit 130 may generate a current by forming a current path between the power voltage VCC terminal and the internal circuit 300 based on the voltage, which is applied to the second node N2, when the current generation circuit 100 operates in the hold mode. For example, the current driving circuit 130 may include a second switch 131 and a driver 132. The second switch 131 may be coupled to the second node N2. In addition, the second switch 131 may be turned on when the current generation circuit 100 operates in the hold mode and turned off when the current generation circuit 100 operates in the sample mode. The driver 132 may couple the power voltage VCC terminal and the internal circuit 300 based on the voltage transferred through the second switch 131. In other words, the driver 132 may be implemented with an NMS transistor having a drain coupled to the power voltage VCC terminal and a source coupled to the internal circuit 300, and a gate coupled to the second switch 131. The second switch 131 may be controlled by the control circuit 1200 shown in FIG. 4.

The internal circuit 300 may include circuits that operate when the power voltage VCC is applied thereto. The mirroring circuit 110, the comparison circuit 120, the current driving circuit 130, and the internal circuit 300 may receive the power voltage VCC being supplied from the same voltage source. For example, the internal circuit 300 may include a page buffer unit.

A method of operating the current generation circuit 100 is described below in detail.

Figure 2A:
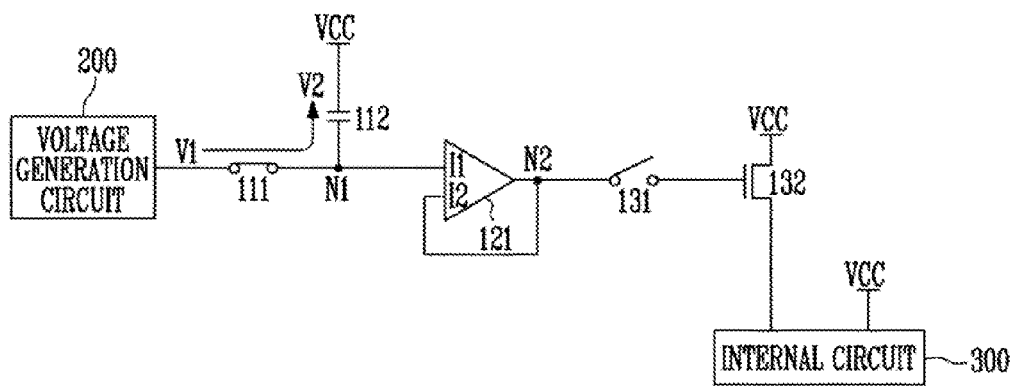
FIGS. 2A and 2B are circuit diagram illustrating a switching operation of the current generation circuit shown in FIG. 1.
Figure 2B:
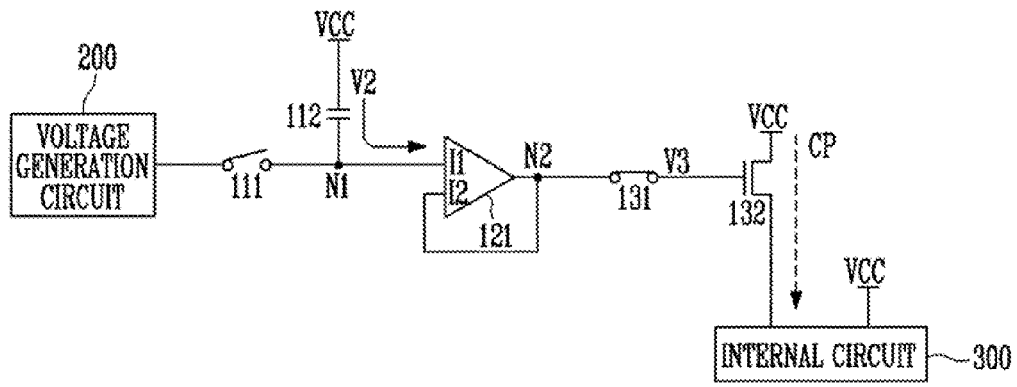

FIGS. 2A and 2B are circuit views illustrating a switching operation of the current generation circuit 100 shown in FIG. 1.

Referring to FIG. 2A, when the current generation circuit 100 operates in a sample mode, the first switch 111 may be turned on, and the second switch 131 may be turned off. When the first switch 111 is turned on, the capacitor 112 may be charged by using the first voltage V1 generated from the voltage generation circuit 200. In order to differentiate the first voltage V1, which is generated by the voltage generation circuit 200, from the voltage charged in the capacitor 112, the voltage charged in the capacitor 112 may be defined as a second voltage V2. When the capacitor 112 is charged with the second voltage V2, the second voltage V2 may also be input to the first input terminal I1 of the operational amplifier 121. During an initial operation, since the second input terminal I2 of the operational amplifier 121 is in a floating state, when the second voltage V2, which is a positive voltage, is applied to the first input terminal the operational amplifier 121 may output a high-level voltage. However, since the second switch 131 is turned off, a gate of the driver 132 may be in a floating state. Therefore, when the current generation circuit 100 operates in the sample mode, a current path may not be established between the power voltage VCC terminal of the current driving circuit 130 and the internal circuit 300.

Referring to FIG. 2B, when the current generation circuit 100 operates in the hold mode, the first switch 111 may be turned off, and the second switch 131 may be turned on. When the first switch 11 is turned off, the first voltage V1, which is generated by the voltage generation circuit 200, may not be transferred to the operational amplifier 121. Therefore, the operational amplifier 121 may be affected by the second voltage V2 charged in the capacitor 112, but not by the voltage generation circuit 200. The second voltage V2 may be applied to the first input terminal I1 of the operational amplifier 121, and a voltage, which is output to an output terminal of the operational amplifier 121, may be fed back to the second input terminal I2 thereof. Since the voltage, which is output from the operational amplifier 121, has a high voltage level substantially the same as the level of the second voltage V2, the operational amplifier 121 may keep outputting a high-level voltage. Since the second switch 131 is turned on, the voltage, which is output from the operational amplifier 121, may be applied to the gate of the driver 132. The voltage, which is output from the operational amplifier 121, may be defined as a third voltage V3 for convenience of illustration. Since the third voltage V3 has a high voltage level (i.e., a positive voltage), the driver 132 may be turned on. When the driver 132 is turned on, the driver 132 may form a current path CP.

When the current path CP is formed, the internal circuit 300 may receive the output current of the current driving circuit 130 and the power voltage VCC, and perform various operations. A description is made in reference to an example in which the internal circuit 300 is a page buffer unit.

The page buffer unit may include a plurality of page buffers. Therefore, when the page buffers operate at the same time, a voltage level of the power voltage VCC may be temporarily reduced. The temporary reduction in power voltage level may be referred to as a voltage drop. Since the mirroring circuit 110 and the current driving circuit 130 of the current generation circuit 100 receive the same power voltage VCC applied to the internal circuit 300, when the voltage level of the power voltage VCC being applied to the internal circuit 300 is temporarily reduced, the voltage level of the power voltage VCC being applied to the mirroring circuit 110 and the current driving circuit 130 may also be temporarily reduced.

When the voltage level of the power voltage VCC applied to the voltage mirroring circuit 110 is temporarily reduced, the voltage level of the second voltage V2 being applied to the first node N1 may also be temporarily reduced by coupling effect of the capacitor. When the level of the voltage, which is applied to the first input terminal I1, is temporarily reduced to be lower than that of the voltage, which is applied to the second input terminal I2 of the operational amplifier 121, due to the temporary reduction in the voltage level of the second voltage V2, the third voltage V3 may also be temporarily reduced.

The voltages applied to the gate and the drain of the driver 132, which is included in the current driving circuit 130, may be temporarily reduced at the same time since the current driving circuit 130 also receives the same power voltage VCC applied to the mirroring circuit 110 and the internal circuit 300. In other words, when the voltage level of the power voltage VCC is temporarily reduced by operations of the internal circuit 300, since the voltage applied to the gate of the driver 132 as well as the drain thereof is also temporarily reduced, a level difference may not occur between the gate and the drain of the driver 132. As a result, variations in the amount of current flowing through the current path CP may be prevented. For example, when the current, which is generated by the current generation circuit 100, is used as a reference current in the internal circuit 300, a reference current having a constant voltage level may be generated regardless of variations in the power voltage VCC. Accordingly, reliability of the current generation circuit 100 may be improved.

Figure 3:
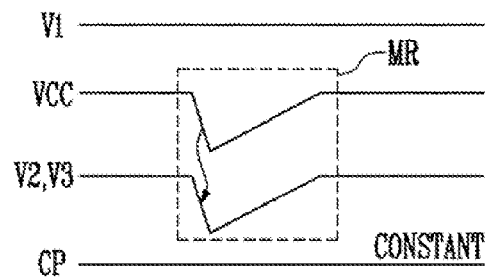
FIG. 3 is a tinning diagram illustrating an operation of the current generation circuit shown in FIGS. 1, 2A and 2B.

FIG. 3 is a timing diagram illustrating an operation of the current generation circuit 100 shown in FIGS. 1, 2A and 2B.

Referring to FIG. 3, it is assumed that the current generation circuit 100 operates in the hold mode.

When the current generation circuit 100 operates the hold mode, the first switch 111 of the mirroring circuit 110 may be turned off, and the second switch 131 of the current driving circuit 130 may be turned on, so that the current driving circuit 130 may form the current path CP by the second voltage V2 charged in the capacitor 112.

Meanwhile, when the internal circuit 300 operates, the voltage level of the power voltage VCC, which is output from the same voltage source, may be temporarily reduced. For example, the voltage levels of the power voltage VCC being supplied to the internal circuit 300, the power voltage VCC being supplied to the current driving circuit 130, and the power voltage VCC being supplied to the mirroring circuit 110 may be temporarily reduced. In the mirroring circuit 110, when the voltage level of the power voltage VCC is reduced by mirroring (MR), the voltage level of the second voltage V2 may be reduced by coupling effect of the capacitor. In the comparison circuit 120, the voltage level of the third voltage V3 may be reduced. The current driving circuit 130 may operate based on the power voltage VCC and the third voltage V3. Since the voltage levels of the power voltage VCC and the third voltage V3 are temporarily reduced at the same time, a constant current may be generated by maintaining the constant current path CP formed by the driver 132.

As described above, even when the voltage level of the power voltage VCC is temporarily reduced while the internal circuit 300 is operating, the current generation circuit 100 may generate a constant current and apply the constant current to the internal circuit 300. As a result, the reliability of various operations of the internal circuit 300 may be improved.

Figure 4:
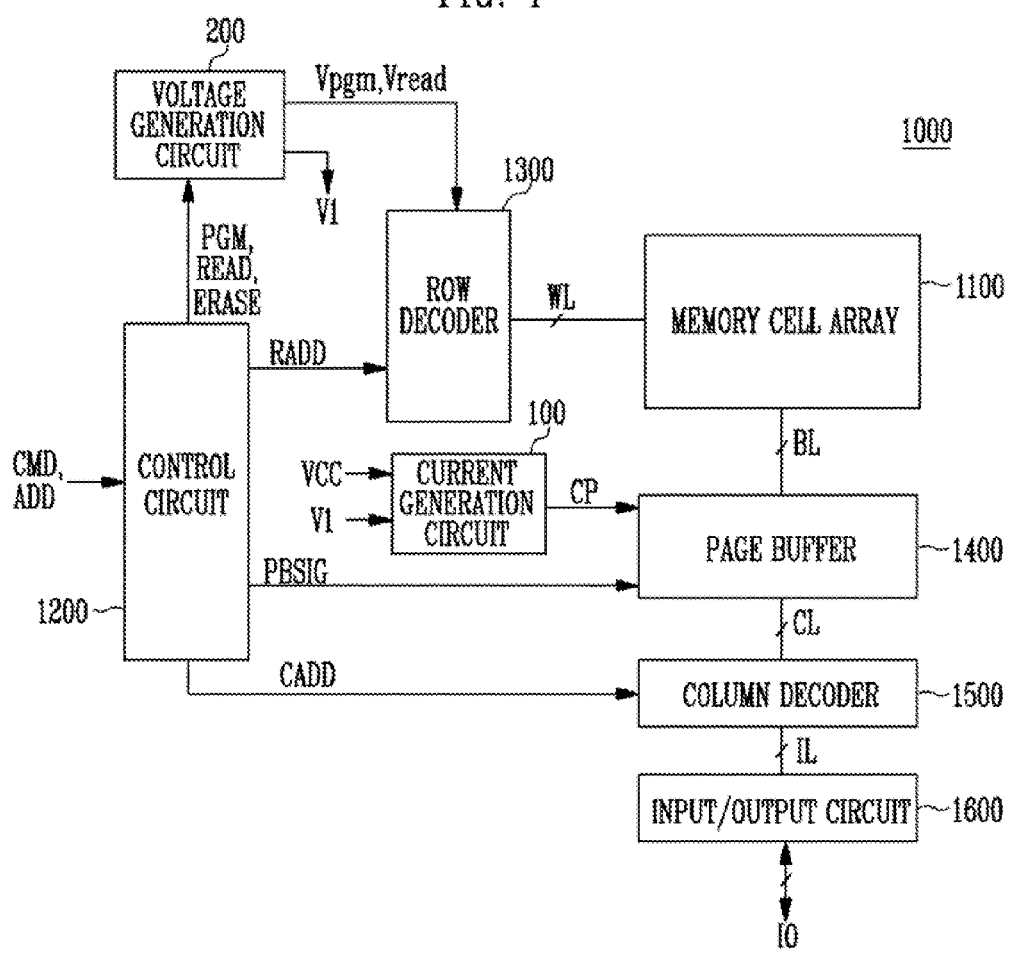
FIG. 4 is a block diagram of a semiconductor device including the current generation circuit shown in FIG. 1.

FIG. 4 is a block diagram of a semiconductor device including the current generation circuit 100 shown in FIG. 1.

Referring to FIG. 4, the semiconductor device 1000 may include a memory cell array 1100, peripheral circuits 100, 200, 1300, 1400, 1500 and 1600 and a control circuit 1200. The memory cell array 1100 may store data. The peripheral circuits 100, 200, 1300, 1400, 1500 and 1600 may program the memory cell array 1100 with data, or read or erase the stored data. The control circuit 1200 may control the peripheral circuits 100, 200, 1300, 1400, 1500 and 1600.

The memory cell array 1100 may include a plurality of memory blocks in which data is stored. The memory blocks may have similar configurations and include two-dimensional or three-dimensional structured cell strings.

The control circuit 1200 may output operating signals PGM, READ and ERASE, a row address RADD, a column address CADD and page buffer control signals PBSIG in response to a command signal CMD and an address ADD.

The current generation circuit 100 may include a mirroring circuit and form the current path CP based on the power voltage VCC and the first voltage V1. The constant current path CP may be formed even when the voltage level of the power voltage VCC is temporarily reduced, thereby generating a current having a constant level.

The voltage generation circuit 200 may generate operating voltages Vpgm, Vread and V1 in response to the operating signals PGM, READ and ERASE. For example, when a program signal PGM applied to the voltage generation circuit 200, the voltage generation circuit 200 may generate voltages (Vpgm) for a program operation in response to the program signal PGM.

The row decoder 1300 may select one of the memory blocks, which is included in the memory cell array 110, and may transfer operating voltages to word lines WL of a selected memory block in response to the row address RADD.

The page buffer unit 1400 may be coupled to the memory cell array 1100 through bit lines BL and transfer data to the memory cell array 1100 or receive the data, which are stored in the memory cell array 1100, in response to the page buffer control signals PBSIG. In addition, the page buffer unit 1400 may receive a constant current (e.g., reference current), which is generated by the current generation circuit 100, during a read or verification operation and perform a sensing operation using the constant current.

The column decoder 1500 may be coupled to the page buffer unit 1400 through column lines CL and transfer data to each of the page buffers in response to a column address CADD.

The input/output circuit 1600 may be coupled to the column decoder 1500 through input/output lines IL and exchange input/output data IQ with the column decoder 1500.

As described above, the current generation circuit 100 of the semiconductor device 1000 may generate a constant current and may transfer the constant current to the page buffer unit 1400. However, the current generation circuit 100 may be coupled to other circuits requiring the constant current, in addition to the page buffer unit 1400.

Figure 5:
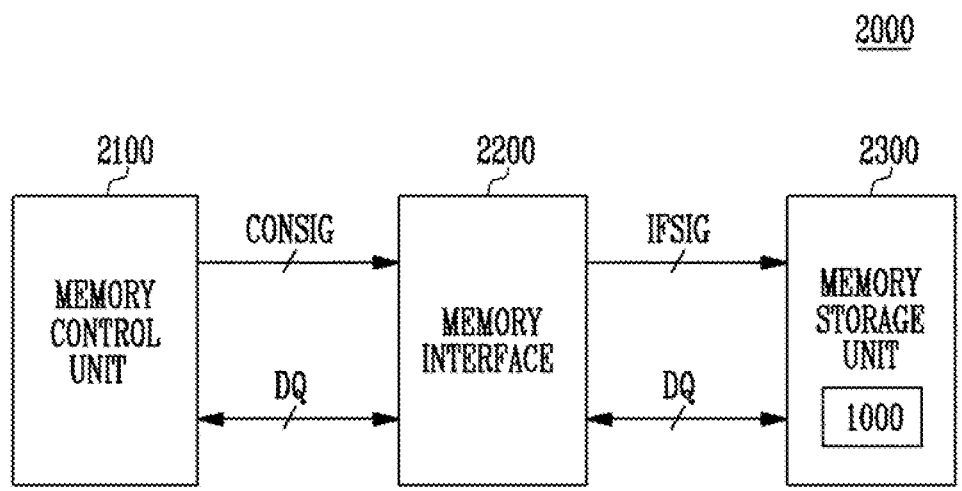
FIG. 5 is a block diagram of a memory system including the semiconductor device shown in FIG. 4.

FIG. 5 is a block diagram illustrating a memory system including the semiconductor device shown in FIG. 4.

Referring to FIG. 5, the memory system 2000 may include a memory control unit 2100, a memory interface 2200, and a memory storage unit 2300.

The memory control unit 2100 may apply control signals CONSIG to the memory interface 2200 through a plurality of pins in response to an external command that is input through a system bus. For example, the memory control unit 2100 may apply the control signals CONSIG to the memory interface 2200 through address pins, a chip enable signal pin, a selection signal pin, an output enable signal pin, a reset signal pin, a write enable signal pin a write inhibit signal pin a clock signal pin, and an address effective input signal pin. In addition, the memory control unit 2100 may exchange data DQ with the memory interface 2200 through data pins.

The memory interface 2200 may exchange the data DQ with the memory storage unit 2300 by applying interface signals IFSIG including the command signal and the address to the memory storage unit 2300 in response to the control signals CONSIG.

The memory storage unit 2300 may include the semiconductor device 1000 in which data is stored. The semiconductor device 1000 may perform program, read, and erase operations in response to the interface signals IFSIG. The semiconductor device 1000 may include a current generation circuit configured to generate a constant current despite temporary changes in the power voltage VCC. Since the semiconductor device 1000 uses a constant current, which is generated by the current generation circuit, during a read operation or a verification operation, the reliability of the semiconductor device 1000 may be improved. Therefore, the reliability of the memory storage unit 2300 having the semiconductor device 1000 with the improved reliability may also be improved, and the memory system including the memory storage unit 2300 may also be improved correspondingly.

According to the embodiments of the present invention, since a current (e.g., reference current) having a constant level may be generated regardless of temporary changes in power voltage, reliabilities of a semiconductor device and a memory system performing read and verification operations may be improved.

In the drawings and specification, typical exemplary embodiments of the invention have been disclosed. Although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A current generation circuit, comprising:
   a mirroring circuit suitable for charging a voltage, wherein a level of a charged voltage by the mirroring circuit varies in response to changes in a level of a power voltage;
   a comparison circuit suitable for comparing the charged voltage with a feedback voltage, wherein the comparison circuit includes an operational amplifier having a first input terminal to which the charged voltage is applied and a second input terminal to which the feedback voltage is applied; and
   a current driving circuit suitable for generating a current based on a voltage output from the comparison circuit,
   wherein the mirroring circuit, the comparison circuit and the current driving circuit receive the power voltage being supplied from the same voltage source, and the charged voltage, the feedback voltage and the voltage output from the comparison circuit are varied at the same time.

2. The current generation circuit of clam 1, wherein the mirroring circuit comprises:
   a first switch suitable for selectively transferring the bias voltage to a first node; and
   a capacitor coupled between the first node and a terminal for supplying the power voltage.

3. The current generation circuit of claim 2, wherein the level of the charged voltage is changed by coupling effect of the capacitor when the first switch is turned off.

4. The current generation circuit of claim 1, wherein the feedback voltage is substantially the same as a voltage output from the operational amplifier.

5. The current generation circuit of claim 1, wherein the current driving circuit comprises:
   a driver coupled between a current output terminal and a terminal for supplying the power voltage, wherein the driver is suitable for generating a current by forming a current path based on the voltage output from the comparison circuit; and
   a second switch suitable for selectively transferring the voltage output from the comparison circuit to the driver.

6. A semiconductor device, comprising:
   a memory cell array including a plurality of memory blocks storing data;
   a page buffer unit suitable for exchanging data with the memory cell array through bit lines and performing a sensing operation using a reference current; and
   a current generation circuit suitable for generating the reference current, which is constant regardless of variations in a level of a power voltage,
   wherein current generation circuit comprises,
      a mirroring circuit suitable for charging a voltage, which is generated by an internal voltage generation circuit, wherein a level of a charged voltage by the mirroring circuit varies in response to changes in the level of the power voltage, wherein the mirroring circuit comprises a first switch suitable for selectively transferring a bias voltage to a first node and a capacitor coupled between the first node and a terminal for supplying the power voltage;
      a comparison circuit suitable for comparing the charged voltage with a feedback voltage; and
      a current driving circuit suitable for generating the reference current based on a voltage output from the comparison circuit,
   wherein the charged voltage, the feedback voltage and the voltage output from the comparison circuit are varied at the same time.

7. The semiconductor device of claim 6, wherein the comparison circuit includes an operational amplifier having a first input terminal to which the charged voltage is applied and a second input terminal to which the feedback voltage is applied, and
   wherein the feedback voltage is substantially the same as a voltage output from the operational amplifier.

8. The semiconductor device of claim 6, wherein the current driving circuit comprises:
   a driver coupled between an current output terminal and a terminal for supplying the power voltage, wherein the driver is suitable for generating a current by forming a current path based on the voltage output from the comparison circuit; and
   a second switch suitable for selectively transferring the voltage output from the comparison circuit to the driver.

9. A memory system, comprising:
   a memory control unit suitable for outputting control signals through a plurality of pins in response to an external command input through a system bus;
   a memory interface unit suitable for outputting interface signals including a command signal and an address in response to the control signals; and
   a memory storage unit including a semiconductor device storing data,
   wherein the semiconductor device includes a current generation circuit suitable for generating a reference current,
   wherein current generation circuit comprises,
      a mirroring circuit suitable for charging a voltage, which is generated by an internal voltage generation circuit, wherein a level of a charged voltage by the mirroring circuit varies in response to changes in a level of a power voltage, wherein the mirroring circuit comprises a first switch suitable for selectively transferring a bias voltage to a first node and a capacitor coupled between the first node and a terminal for supplying the power voltage;
      a comparison circuit suitable for comparing the charged voltage with a feedback voltage; and
      a current driving circuit suitable for generating the reference current based on a voltage output from the comparison circuit, wherein the charged voltage, the feedback voltage and the voltage output from the comparison circuit are varied at the same time.

10. The memory system of claim 9, wherein the memory control unit is suitable for applying the control signals to the memory interface through the pins, and wherein the pins includes address pins, a chip enable signal pin, a selection signal pin, an output enable signal pin, a reset signal pin, a write enable signal pin, a write inhibit signal pin, and a clock signal pin.

11. The memory system of claim 9, wherein the semiconductor device comprises:

a memory cell array including a plurality of memory blocks storing data;

a page buffer unit suitable for exchanging data with the memory cell array through bit lines and performing a sensing operation using a reference current; and the current generation circuit suitable for generating the reference current, which is constant regardless of variations in a level of a power voltage, and supplying the reference current to the page buffer unit.

12. The memory system of claim 9, wherein the comparison circuit includes an operational amplifier having a first input terminal to which the charged voltage is applied and a second input terminal to which the feedback voltage is applied, and wherein the feedback voltage is substantially the same as a voltage output from the operational amplifier.

13. The memory system of claim 9, wherein the current driving circuit comprises:

a driver coupled between an current output terminal and a terminal for supplying the power voltage, wherein the driver is suitable for generating a current by forming a current path based on the voltage output from the comparison circuit; and a second switch suitable for selectively transferring the voltage output from the comparison circuit to the driver.

* * * * *